United States Patent
Pollack et al.

(10) Patent No.: US 11,244,845 B2
(45) Date of Patent: Feb. 8, 2022

(54) VACUUM CHAMBER ARRANGEMENT AND METHOD FOR PROCESSING A SUBSTRATE

(71) Applicant: VON ARDENNE Asset GmbH & Co. KG, Dresden (DE)

(72) Inventors: Joerg Pollack, Wilsdruff (DE); Lutz Gottsmann, Grossroehrsdorf (DE); Georg Laimer, Meissen (DE)

(73) Assignee: VON ARDENNE ASSET GMBH & CO. KG, Dresden (DE)

( * ) Notice: Subject to any disclaimer, the term of this patent is extended or adjusted under 35 U.S.C. 154(b) by 538 days.

(21) Appl. No.: 16/142,037

(22) Filed: Sep. 26, 2018

(65) Prior Publication Data

US 2019/0093213 A1  Mar. 28, 2019

(30) Foreign Application Priority Data

Sep. 27, 2017 (DE) ..................... 10 2017 122 464.5
Dec. 12, 2017 (DE) ..................... 10 2017 129 603.4

(51) Int. Cl.
*H01L 21/677* (2006.01)
*H01L 21/67* (2006.01)
(Continued)

(52) U.S. Cl.
CPC ...... *H01L 21/67742* (2013.01); *C23C 14/505* (2013.01); *C23C 14/54* (2013.01);
(Continued)

(58) Field of Classification Search
None
See application file for complete search history.

(56) References Cited

U.S. PATENT DOCUMENTS 4,192,253 A 3/1980 Aichert et al.
5,570,992 A * 11/1996 Lemelson ............. B25J 9/1015
414/744.3
(Continued)

FOREIGN PATENT DOCUMENTS

DE 28 13 180 C2 10/1979

OTHER PUBLICATIONS

German Search Report based on 10 2017 129 603.4 (8 pages) dated Aug. 21, 2018 (for reference purpose only).

*Primary Examiner* — Michael S Lowe
(74) *Attorney, Agent, or Firm* — Viering, Jentschura & PartnermbB

(57) ABSTRACT

A vacuum chamber having a vacuum chamber; at least one processing region arranged in the vacuum chamber; and a substrate holding arrangement for transporting and/or positioning a substrate or multiple substrates in the processing region, wherein the substrate holding arrangement has: a first drive train with a first substrate holder, the first substrate holder being configured to rotatably hold one or more substrates, a second drive train with a first support arm, wherein the first substrate holder is held rotatably by the first support arm, a third drive train with a second substrate holder, the second substrate holder being configured for rotatably holding one or more substrates, and a fourth drive train with a second support arm, wherein the second substrate holder is held rotatably by the second support arm, and wherein the first, second, third and fourth drive trains are each configured to be controllable independently of one another.

20 Claims, 3 Drawing Sheets

(51) Int. Cl.
    *H01L 21/687*     (2006.01)
    *C23C 16/458*     (2006.01)
    *C23C 14/50*     (2006.01)
    *C23C 14/54*     (2006.01)

(52) U.S. Cl.
    CPC ...... *C23C 16/4582* (2013.01); *H01L 21/6715* (2013.01); *H01L 21/6719* (2013.01); *H01L 21/67109* (2013.01); *H01L 21/67161* (2013.01); *H01L 21/67196* (2013.01); *H01L 21/67207* (2013.01); *H01L 21/67703* (2013.01); *H01L 21/67748* (2013.01); *H01L 21/68764* (2013.01)

(56) References Cited

U.S. PATENT DOCUMENTS

| | | | |
|---|---|---|---|
| 6,182,796 B1* | 2/2001 | Perlstein | B66F 7/065 |
| | | | 187/208 |
| 7,153,088 B2* | 12/2006 | Reimer | H01L 21/681 |
| | | | 414/783 |
| 7,694,688 B2* | 4/2010 | Lester | H01L 21/67766 |
| | | | 134/62 |
| 8,434,992 B2* | 5/2013 | Tara | H01L 21/67742 |
| | | | 414/744.3 |
| 9,623,555 B2* | 4/2017 | Krupyshev | B25J 9/043 |
| 9,691,650 B2* | 6/2017 | Kurita | H01L 21/67742 |
| 10,052,678 B2* | 8/2018 | Takeda | B21D 43/105 |
| 2004/0016406 A1 | 1/2004 | Siniaguine et al. | |
| 2018/0312970 A1* | 11/2018 | Gottsmann | C23C 16/4586 |

* cited by examiner

VACUUM CHAMBER ARRANGEMENT AND METHOD FOR PROCESSING A SUBSTRATE

CROSS-REFERENCE TO RELATED APPLICATIONS

This application claims priority to Application 10 2017 122 464.5, filed in the Federal Republic of Germany on Sep. 27, 2017, and to Application 10 2017 129 603.4, filed in the Federal Republic of Germany on Dec. 12, 2017, the contents of both of which are incorporated herein.

TECHNICAL FIELD

The disclosure relates to a vacuum chamber arrangement and to a method for processing a substrate.

BACKGROUND

In general, a substrate or multiple substrates, for example wafers or other plate-like substrates, may be held by means of a substrate holder for example during a coating process (or other processes for treating substrates). Here, the substrate holder may for example be utilized to hold the substrate or the substrates at a predefined position in a coating chamber or to transport said substrate or substrates through a coating chamber and/or to move said substrate or substrates in the coating chamber.

Substrate holders are conventionally used in conjunction with coating installations which allow substrates held adjacent to one another to be coated on one side (that is to say the front side thereof). If it is necessary to coat the rear side, the substrates are rotated, and are again worked only on one side, for example even if an identical or different coating of the rear side is performed. Alternatively, substrate holders are used in conjunction with coating installations which allow substrates held adjacent to one another to be coated on both sides (that is to say on the front side and on the rear side thereof).

It is conventional for coatings on both sides of a substrate to be formed by virtue of the substrates being subjected, within a directed material flow, to a rotational movement, and/or by virtue of the substrates being led through the material flow by means of a rotational movement.

BRIEF SUMMARY

In various embodiments, a vacuum chamber arrangement is provided for the uniform and/or freely adjustable processing of substrates, for example for the simultaneous processing of a multiplicity of substrates, for example turbine blades, for example aircraft turbine blades, etc.

BRIEF DESCRIPTION OF THE FIGURES

Exemplary embodiments of the disclosure are illustrated in the figures and will be discussed in more detail below.

In the figures.

DETAILED DESCRIPTION

Figure 1A:
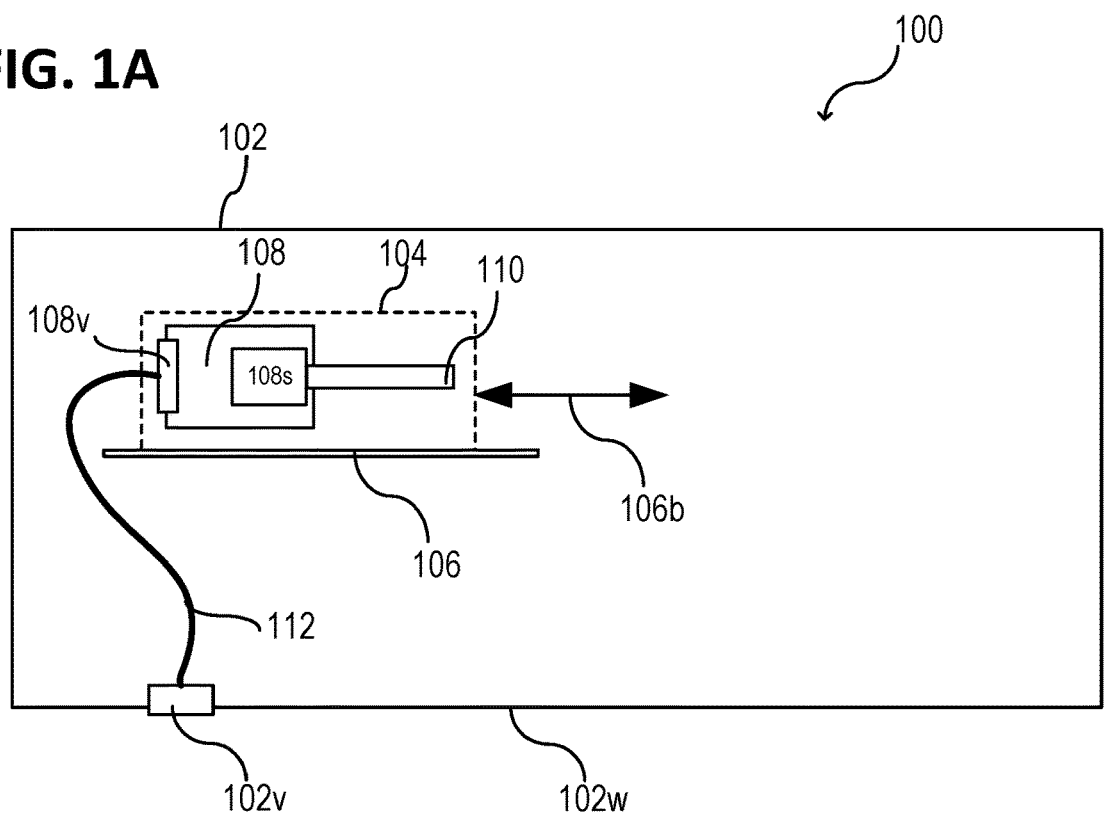
FIGS. 1A and 1B show a vacuum chamber arrangement in a schematic view, according to various embodiments, wherein a substrate holding arrangement is mounted in various positions in a vacuum chamber.

In various embodiments, a vacuum chamber arrangement is provided. The vacuum chamber arrangement has a vacuum chamber and at least one processing region which is arranged in the vacuum chamber. Furthermore, the vacuum chamber arrangement has a substrate holding arrangement for transporting and/or positioning a substrate or multiple substrates in the processing region. The substrate holding arrangement has: a first drive train with a first substrate holder, wherein the first substrate holder is configured to rotatably hold one or more substrates, a second drive train with a first support arm, wherein the first substrate holder is held rotatably by the first support arm, a third drive train with a second substrate holder, wherein the second substrate holder is configured for rotatably holding one or more substrates, and a fourth drive train with a second support arm, wherein the second substrate holder is held rotatably by the second support arm. The first, second, third and fourth drive trains are each configured to be controllable independently of one another.

This permits, for example, a spatially and temporally independent movement of the at least one substrate that is held by the first substrate holder in relation to the movement of at least one substrate or multiple substrates that are held by the second substrate holder.

The substrate holders fastened to two support arms can realize different movement profiles, for example a butterfly wing movement of the substrate holder, for example a rotation about a common axis of rotation with different directions of rotation; or the rotation about a common axis of rotation in the same direction of rotation, for example in a common plane. Here, the substrates may also rotate relative to the substrate holder. The rotational and pivoting movements may take place in program-controlled, freely predefinable and mutually decoupled fashion. This is made possible by means of the four independent drive trains which, independently of one another in terms of time, by means of mechanical coupling elements, permit the movements for the first support arm (pivoting), the second support arm (pivoting), the first substrate holder (substrate rotation) and the second substrate holder (substrate rotation).

The independently controllable drive trains make it possible for the maximum and minimum pivot angles of the respective support arms, the angular speeds and the number of pivoting movements to be predefined in freely configurable fashion. The setpoint value presets for the control of the drive trains may be prepared in a manner dependent on the desired demand profile of the movement of the substrates. The synchronous movement of the two support arms may be realized in the control of the drive trains by means of closed-loop position and rotational speed control. The movement profiles of the substrate rotation of the two substrate holders may be controlled independently of one another. Aside from a standstill state and constant rotation of the substrates, freely configurable movement profiles are also possible, for example a variation of the substrate rotational speed in a manner dependent on the angle of rotation of the substrate itself, a pausing of the substrate at a particular angle of rotation for a definable dwell time, or a combination thereof.

In various embodiments, a drive train has a drive device (source) and a consumer of the drive power (sink), for example a support arm or substrate holder. The drive power can be transmitted by means of a mechanical coupling element from the drive device to the consumer, wherein the mechanical coupling element is mechanically or electrically coupled to the drive device and to the consumer.

In various embodiments, a method for processing a substrate in an abovementioned vacuum chamber arrangement is provided. The method includes pivoting the first support arm independently of the movement or position of the second support arm.

In various embodiments, a method for processing a substrate in an abovementioned vacuum chamber arrangement is provided. The method includes adapting the angular speed during the rotation of the substrate holder in a manner dependent on the angle and the angular speed of the support arm, if the support arm of the first and second support arms is pivoted through an angle with an angular speed.

In the control of the drive trains of the substrate rotation, the rotation of the substrates caused by the pivoting movement of the support arm can be smoothed in the following steps: the present pivot angle of the respective arm is detected by means of position encoders (e.g. rotary encoder), and the resulting rotation of the substrates is calculated therefrom. The present setpoint rotational angle derived from the movement profile of the substrates of the respective arm is provided with an offset. Said offset may correspond to the value, multiplied by "minus one", of the calculated rotation of the substrates (caused by the pivoting movement of the arm).

In the following detailed description, reference is made to the appended drawings, which form part of said description and in which, for illustrative purposes, specific embodiments in which the disclosure can be implemented are shown. In this regard, directional terminology such as for example "upwards", "downwards", "forwards", "rearwards", "front", "rear", etc. is used in relation to the orientation of the described figure(s). Since components of embodiments may be positioned in a number of different orientations, the directional terminology serves for illustrative purposes and is in no way restrictive. It is self-evident that other embodiments may be utilized, and structural or logical modifications made, without departing from the scope of protection of the present disclosure. It is self-evident that the features of the various exemplary embodiments described herein may be combined with one another unless specifically stated otherwise. The following detailed description should therefore not be interpreted in a limiting sense, and the scope of protection of the present disclosure is defined by the appended claims.

In the context of this description, the expressions "connected", "attached" and "coupled" are used to describe both a direct and an indirect connection, a direct or indirect attachment and a direct or indirect coupling. In the figures, identical or similar elements are denoted by identical reference designations where expedient.

Furthermore, it may for example be expedient or necessary to ensure that the substrates are transported in a secure, stable situation during the entire process.

Figure 1B:
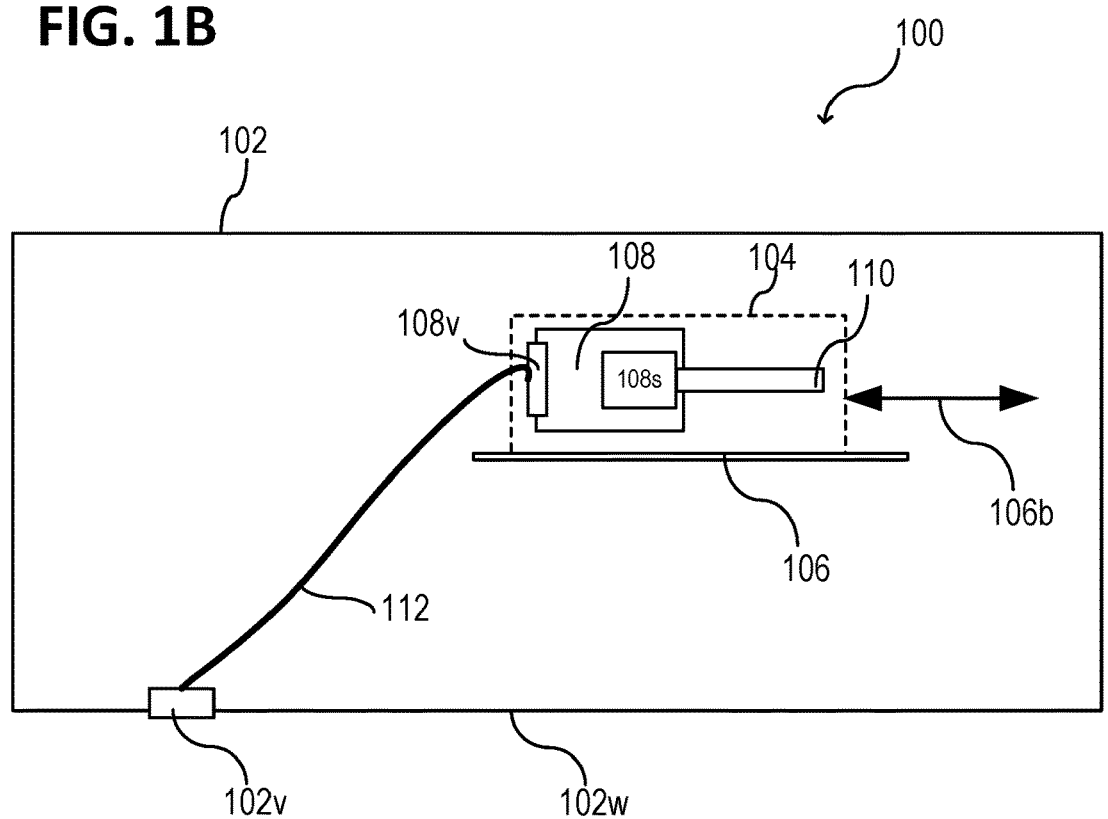

FIG. 1A and FIG. 1B illustrate a processing arrangement, for example vacuum chamber arrangement 100, in a schematic view, according to various embodiments. The vacuum chamber arrangement 100 may for example have a vacuum chamber 102. The vacuum chamber 102 may for example have a first supply feedthrough 102v. The first supply feedthrough 102v may for example be provided in a chamber wall section 102w of the chamber housing of the vacuum chamber 102.

The vacuum chamber arrangement 100 may for example have a substrate holding arrangement 104. The substrate holding arrangement 104 may have a substrate holder 110 for holding and positioning at least one substrate.

The positioning may for example be a setting and/or variation of the spatial situation and/or of the orientation of the substrates relative to a processing source, wherein the processing source is used for processing one or more substrates held by means of the substrate holder 110. For this purpose, the vacuum chamber 102 may have a processing region 202b or a process chamber. Furthermore, the substrate holding arrangement 104 may have a vacuum-tight supply housing 108 for supplying the substrate holder 110 with at least one supply medium, for example with mechanical energy or a torque, with cooling water, or the like.

The substrate holding arrangement 104 has multiple support arms and substrate holders which are assigned to in each case one drive train, wherein the drive trains are configured such that they can be operated or activated in each case independently of one another, as will be described in more detail below. The independent operation or the independent controlling (e.g. driving) of the drive trains permits freely adjustable movement profiles for the support arms and substrate holders. In this way, it is for example possible for coatings on the substrates to be processed, for example deposited, more homogeneously. Furthermore, malfunctions of the vacuum chamber arrangement, for example if support arms and/or substrate holders block one another in terms of their movement, can be more easily resolved. Furthermore, the drive power of each drive train can be individually set, configured or tailored for the drive power required from the respective support arm or substrate holder.

In the supply housing 108, there may be arranged a supply structure 108s for supplying the substrate holder 110 with the at least one supply medium. The supply structure 108s may for example have or provide the drive devices of the drive trains which supply structure is coupled to the substrate holder 110 for the purposes of positioning the substrates.

In various embodiments, the supply housing 108 may have a second supply feedthrough 108v. The supply housing 108 may for example be supplied with one or more media (for example electrical energy and/or coolant) by means of the second supply feedthrough 108v.

Furthermore, the vacuum chamber arrangement 100 may for example have a bearing arrangement 106 (also denoted e.g. as mounting arrangement 106) by means of which the substrate holding arrangement 104 is mounted movably 106b within the vacuum chamber 102.

Furthermore, the vacuum chamber arrangement 100 may for example have a (for example vacuum-tight) supply hose 112. The supply hose 112 may for example connect the first supply feedthrough 102v of the vacuum chamber 102 to the second supply feedthrough 108v of the supply housing 108. In various embodiments, the circumferential wall of the supply hose 112 may be vacuum-tight.

Figure 2A:
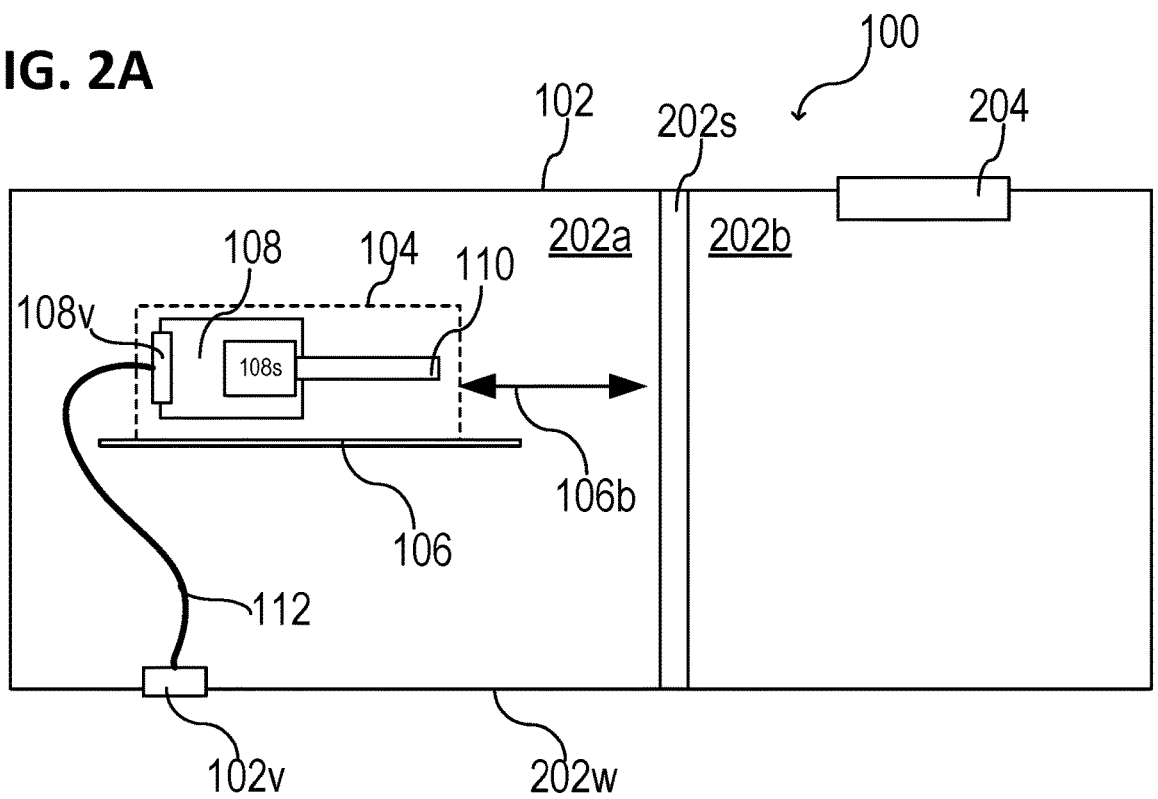
FIGS. 2A and 2B show a vacuum chamber arrangement with a sluice chamber and a process chamber in a schematic view, according to various embodiments.
Figure 2B:
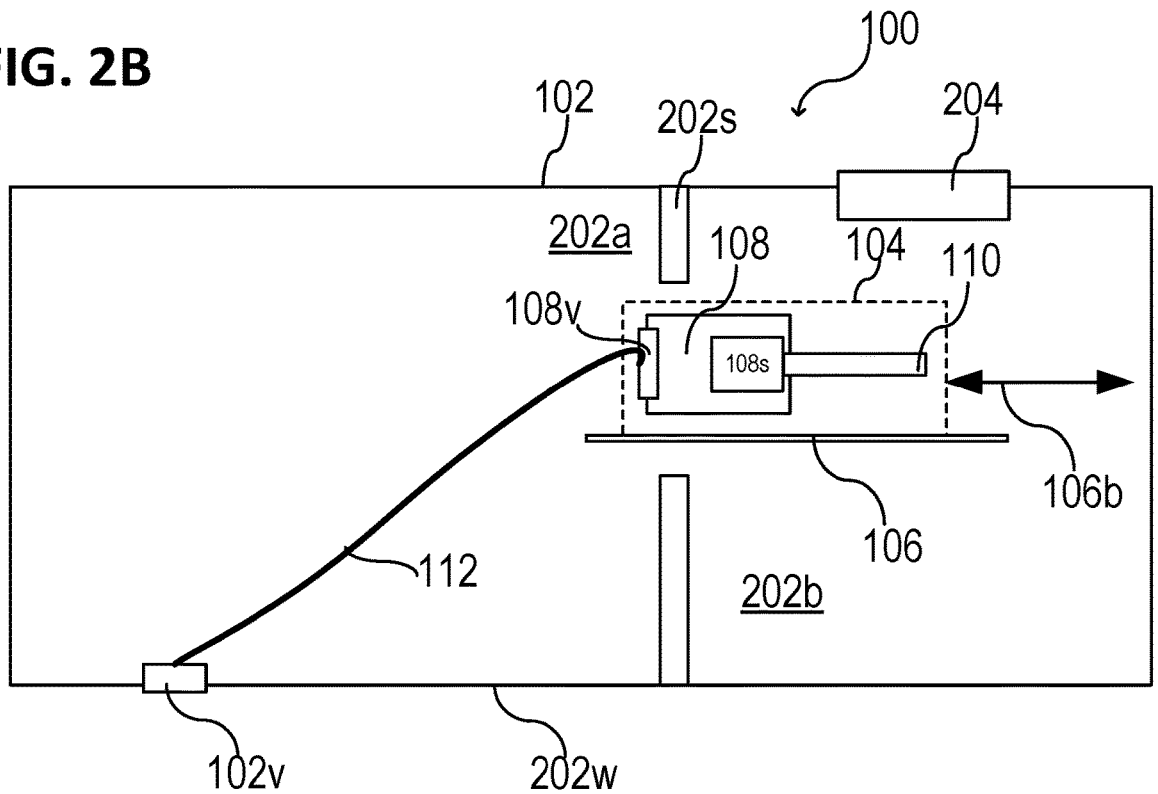

FIG. 2A and FIG. 2B illustrate a vacuum chamber arrangement 100 in a schematic view, according to various embodiments. Here, the vacuum chamber 102 has a sluice chamber 202a and at least one process chamber 202b. Furthermore, a valve arrangement 202s (for example a flap valve, a slide valve or some other suitable vacuum valve) may be used for separating the sluice chamber 202a from the at least one process chamber 202b in terms of a vacuum.

The at least one process chamber 202b may for example have a heating chamber and a coating chamber. The process chamber 202b may also be referred to as processing region 202b.

According to various embodiments, the first supply feedthrough 102v may be arranged in a chamber wall section 202w of the sluice chamber 202a, and the bearing arrangement 106 may for example be configured such that at least the substrate holder 110 of the substrate holding arrangement 104 can be moved out of the sluice chamber 202a into the at least one process chamber 202b and/or such that at least the substrate holder 110 of the substrate holding arrangement 104 can be moved out of the at least one process chamber 202b into the sluice chamber 202a.

In various embodiments, the supply structure 108s may have the electrical drive devices of the multiple drive trains (for example one or more electric motors) for the purposes of driving the positioning of the at least one substrate, as will be described in more detail below.

The substrate holder 110 may for example have one or more joints, which provide one or more degrees of freedom of movement for the positioning of the at least one substrate by means of the substrate holder 110.

In various embodiments, the substrate holding arrangement 104 may be mounted by means of the bearing arrangement 106 so as to be movable 106b between at least one first and one second position. The substrate holder 110 may for example be arranged within the sluice chamber 202a in the first position and arranged within the at least one process chamber 202b in the second position. As can be seen, the substrate holder 110 can be positioned at various positions in the vacuum chamber 102.

In various embodiments, the bearing arrangement 106 serves for positioning the entire substrate holding arrangement 104 in the vacuum chamber 102, and the substrate holder 110 of the substrate holding arrangement 104 serves for positioning the substrates relative to a processing device 204 for processing the substrates, for example for homogeneously coating the substrates.

For the equipping of the substrate holder 110 of the substrate holding arrangement 104 with at least one substrate or for the removal of at least one substrate from the vacuum chamber, the substrate holder 110 or the substrate holding arrangement 104 can be moved into the sluice chamber 202a, the process chamber 202b can be separated from the sluice chamber 202a by means of the valve arrangement 202s, and the sluice chamber 202a can for example be opened, such that access to the substrate holder 110 is provided.

The vacuum chamber arrangement 100 may for example have a processing source 204 formed as a coating source. The coating source may have one or more crucibles in which material for evaporation (also referred to as material for sublimation) can be provided. The evaporation energy can be provided by means of one or more electron guns. During coating of the substrates by means of electron beam evaporation, the at least one crucible can be arranged below the substrates, such that the substrates are coated from below. Alternatively, a different coating device may be used for coating the substrates, for example a sputtering arrangement or the like.

In various embodiments, the substrate holder 110 may have at least one first pivotably mounted support arm and one second pivotably mounted support arm. A pivotably mounted support arm has in each case at least one rotatably mounted substrate holder, which may have in each case one or more rotatably mounted substrate receptacles for receiving and positioning the at least one substrate.

Furthermore, the vacuum chamber 102 may have one or more process chambers 202b, sluice chambers 202a, etc., which can be closed off in vacuum-tight fashion. The individual chambers can, by means of an evacuation device (for example having one or more vacuum pumps and, for example optionally, a gas supply), be brought into a state with a predefined process atmosphere with a pressure of lower than 1 mbar, for example lower than $10^{-2}$ mbar, for example lower than $10^{-4}$ mbar, for example lower than $10^{-6}$ mbar.

In various embodiments, the processing of the substrates, in particular the coating of one or more turbine blades with a thermal protection layer, may be performed at a process temperature of for example higher than 800° C. Thermal protection layers, so-called thermal barrier coatings (TBC), may be formed for example from yttrium-stabilized zirconium dioxide (ZrO2). Alternatively, other suitable (for example metallic and/or ceramic) materials may be deposited as functional layers onto the substrates, for example adhesion promoter layers (also referred to as bond coat).

In various embodiments, the supply hose 112 may be vacuum-tight and flexible and may have a length such that the substrate holding arrangement 104 can be moved 106b within the vacuum chamber 102 whilst the vacuum-tight supply hose 112 simultaneously connects the first supply lead through 102v and the second supply lead through 108v to one another. In various embodiments, it is for example possible for a corrugated hose (for example an ISO-KF or ISO-CF hose) to be used as supply hose 112.

The supply hose 112, which is for example vacuum-tight, the vacuum-tight supply housing 108 and the first supply feedthrough 102v and the second supply feedthrough 108v may be configured such that the interior of the supply hose 112 and the interior of the supply housing 108 are separated from the interior of the vacuum chamber 102 in terms of a vacuum. It is thus possible, for example, for a higher pressure (for example normal atmospheric pressure) to be provided in the supply hose 112 and in the supply housing 108 than in the vacuum chamber.

Within the supply hose 112 there may for example be arranged at least one electrical supply line, for example for the multiple drive trains, and/or at least one coolant supply line.

The bearing arrangement 106 may for example define a movement plane (also referred to as transport plane) within which the substrate holding arrangement 104 can be moved 106b by means of the bearing arrangement 106. Furthermore, the supply hose 112 may be led in a supply plane which is oriented perpendicular or parallel to the movement plane.

The supply hose 112 may for example form a common protective sheath for multiple supply lines, wherein the multiple supply lines can be led within the supply hose 112 from outside the vacuum chamber 102 into the supply housing 108. Alternatively, the supply hose 112 may also lead only one supply line, or may be configured as a supply line.

The supply hose 112 may for example be flexible, for example such that it can be led in the vacuum chamber for example with a bending radius of smaller than 1 m.

Figure 3A:
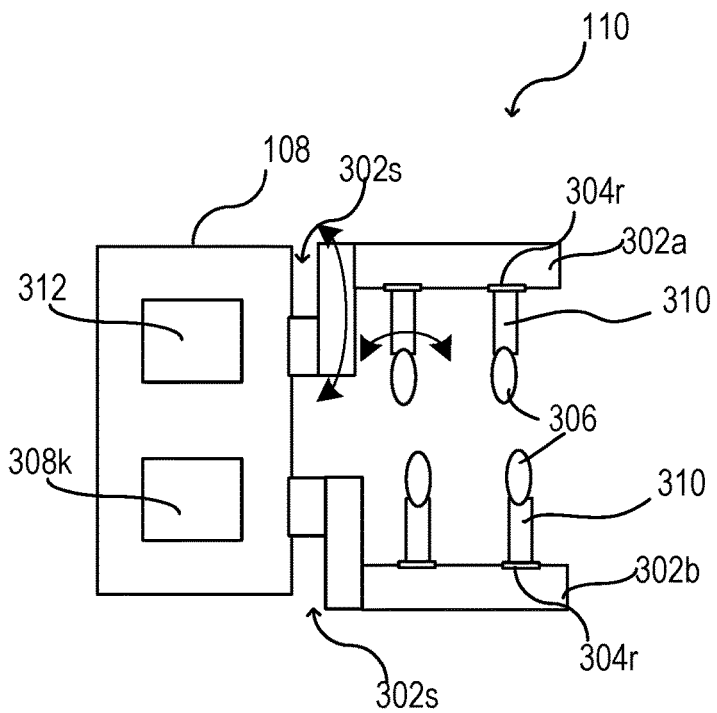
FIGS. 3A and 3B show a substrate holder and a supply housing in a schematic view, according to various embodiments.
Figure 3B:
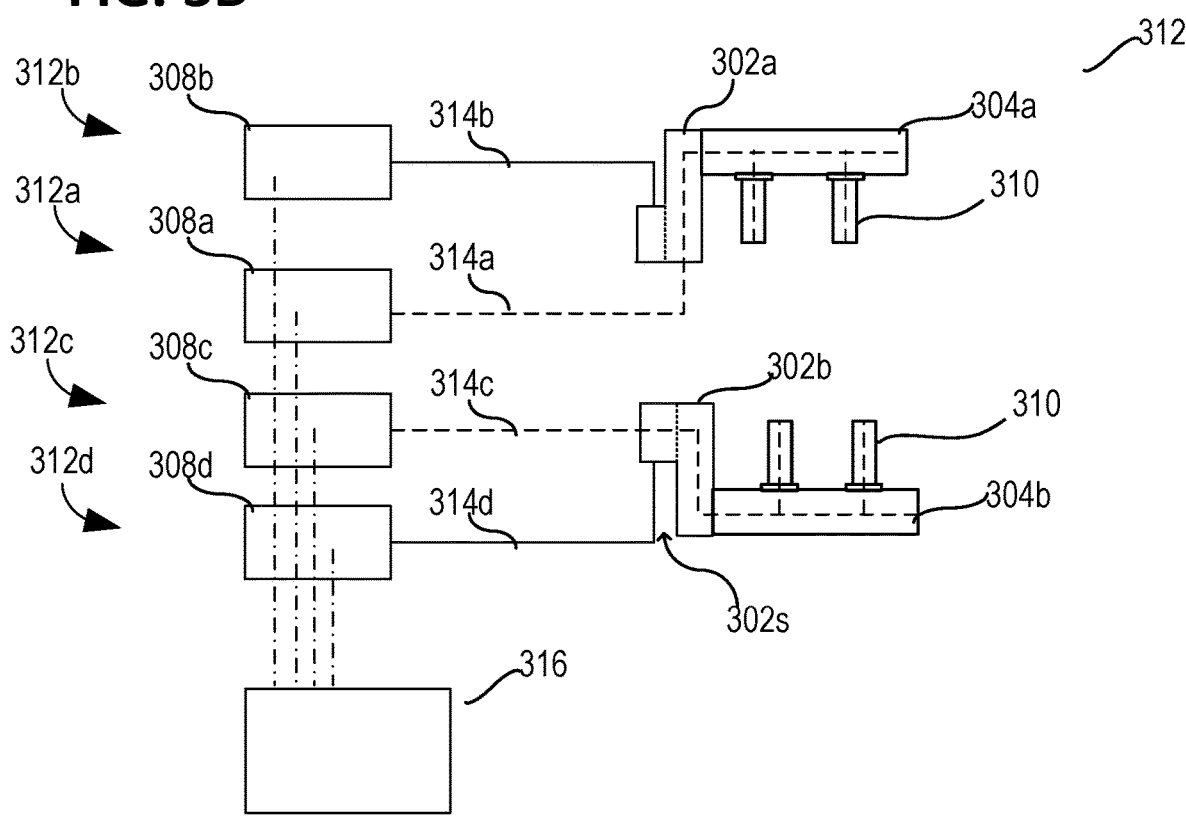

FIG. 3A and FIG. 3B illustrate a substrate holder 110 in a schematic view, according to various embodiments. The substrate holder 110 is for example configured to hold multiple substrates 306. As described above, the substrate holder 110 may be mounted on the supply housing 108 or may be mounted and may be moved by means of a drive system 312 which is arranged at least in sections in the supply housing 108. The drive system 312 with multiple independent drive trains 312*a*, 312*b*, 312*c*, 312*d* (312*a-d*) is illustrated in more detail in FIG. 3B.

In various embodiments, the drive system 312 and the substrate holder 110 may be configured such that a predefined movement pattern can be transmitted to the substrates 306. It is self-evident that, for this purpose, use may be made of a correspondingly configured mechanism, for example having motors, gear wheels, toothed belts, flat belts, rollers, pulleys etc., and a correspondingly configured control device 316.

The control device 316 may for example be a microprocessor, an integrated circuit, an application-specific integrated circuit (ASIC), an interface to a computer, and/or an item of software. The control device 316 may be connected to each drive train 312*a-d* in order to operate, for example activate, said drive train independently of the other drive trains 312*a-d*.

In one embodiment, use may be made of multiple (for example two) support arms 302*a*, *b* which are mounted so as to be pivotable and/or rotatable by means of a joint 302*s*, wherein multiple substrate receptacles 310 may be mounted on each of the multiple support arms 302*a*, *b*. The substrate receptacles 310 may be mounted so as to be pivotable and/or rotatable for example by means of a further joint 304*r*. The substrate receptacles 310 are for example configured such that in each case at least one substrate 306 can be fixed to each of the substrate receptacles 310. In various embodiments, the pivot axis/axis of rotation (illustrated in FIG. 3A by means of a double arrow) of the joint 302*s* may be oriented at an angle (for example substantially at a rectangular angle) with respect to the pivot axis/axis of rotation (illustrated in FIG. 3A by means of a double arrow) of the further joint 304*r*. It is self-evident that other configurations may be used in order to correspondingly hold and if appropriate position (for example orient, rotate, pivot, etc.) one or more substrates 306 by means of the substrate holder 110.

In various embodiments, a drive train 312*a-d* has a drive device 308*a*, 308*b*, 308*c*, 308*d* (308*a-d*) (source of drive power) and a consumer of the drive power (sink), for example a support arm 302*a*, 302*b* or substrate holder 304*a*, 304*b* with rotatably mounted substrate receptacles 310. The drive power can be transmitted by means of a mechanical coupling element 314*a*, 314*b*, 314*c*, 314*d* (314*a-d*) from the drive device 308*a-d* to the consumer 302*a*, 302*b*, 304*a*, 304*b*, 310, wherein the mechanical coupling element 314*a-d* is mechanically and/or electrically coupled to the drive device 308*a-d* and to the consumer 302*a*, 302*b*, 304*a*, 304*b*, 310.

In various embodiments, the substrate holding arrangement 104 has: a first drive train 312*a* with a first substrate holder 304*a*, wherein the first substrate holder 304*a* is configured for rotatably holding one or more substrates 306, a second drive train 312*b* with a first support arm 302*a*, wherein the first substrate holder 304*a* is held rotatably by the first support arm 302*a*, a third drive train 312*c* with a second substrate holder 304*b*, wherein the second substrate holder 304*b* is configured for rotatably holding one or more substrates 306, and a fourth drive train 312*d* with a second support arm 302*b*, wherein the second substrate holder 304*b* is held rotatably by the second support arm 302*b*. The first, second, third and fourth drive trains 312*a*, 312*b*, 312*c*, 312*d* are in each case configured to be controllable independently of one another.

In various embodiments, the first support arm 302*a* and the second support arm 302*b* are mounted so as to be movable independently of one another, for example are mounted so as to be rotatable independently of one another.

In various embodiments, the second drive train 312*b* and the fourth drive train 312*d* have in each case one drive device and one mechanical coupling element which is connected to a drive device, and the mechanical coupling element is configured to transmit the drive power of the drive device for the rotation of the substrate receptacle(s) 310 of the substrate holder 304*a*, *b* to the substrate holder 304*a*, *b*. As is shown, in this way, one or more substrate receptacles 310 of the substrate holder 304*a*, *b* are rotated.

In various embodiments, the first drive train 312*a* and the third drive train 312*c* have in each case one drive device and one mechanical coupling element which is connected to the drive device, and the mechanical coupling element is configured to transmit the drive power of the drive device for the pivoting of the support arm 302*a*, *b* to the support arm 302*a*, *b*.

In various embodiments, the mechanical coupling elements 314*a*, 314*b*, 314*c* and 314*d* may be shafts, bearing points, gearwheels, for example traction mechanism drives, for example flat belts, V-belts, toothed belts or chain drives, or a combination of these, for example all mechanical components of a drive train aside from the drive device.

In various embodiments, the first drive train 312*a* and the third drive train 312*c* have in each case one first drive device, and the second drive train 312*b* and the fourth drive train 312*d* have in each case one second drive device which differs from the first drive device.

In various embodiments, the first, second, third and fourth drive trains 312*a*, 312*b*, 312*c*, 312*d* have in each case one drive device, and the substrate holding arrangement 104 is configured such that the drive devices of the first, second, third and fourth drive trains are arranged outside the vacuum region.

In various embodiments, the first and second support arms 302*b* and the first and second substrate holders 304*b* are arranged in the vacuum region.

In various embodiments, vacuum chamber arrangement 100 has a control device 316 which is connected to the first, second, third and fourth drive trains 312*d* (illustrated in FIG. 3B by means of the dash-dotted line) and is configured to control the movement of the first and second support arms 302*b* and of the first and second substrate holders 304*a*, *b*, for example of the respective substrate receptacles 310.

In various embodiments, the control device 316 is configured such that the first support arm 302*a* and the second support arm 302*b* are rotatable in the same direction of rotation about a common axis of rotation.

In various embodiments, the control device 316 is configured such that the first support arm 302*a* and the second support arm 302*b* are rotatable in opposite directions of rotation about a common axis of rotation.

In various embodiments, the control device 316 is configured such that, during a pivoting of a support arm of the first and second support arms 302*b* through an angle with an angular speed, the angular speed of the rotation of the substrate holder is adapted in a manner dependent on the angle and the angular speed of the support arm.

In various embodiments, a method for processing a substrate in a vacuum chamber arrangement 100 is provided, wherein the vacuum chamber arrangement 100 is configured according to an embodiment described above. The method includes pivoting the first support arm 302*a* independently of the movement or position of the second support arm 302*b*.

In various embodiments, a method for processing a substrate in a vacuum chamber arrangement 100 is provided, wherein the vacuum chamber arrangement 100 is configured according to an embodiment described above. The method includes adapting the angular speed during the rotation of the substrate holder in a manner dependent on the angle and the angular speed of the support arm, if the support arm of the first and second support arms 302b is pivoted through an angle with an angular speed.

The described methods may, in some embodiments, include the first support arm 302a and the second support arm 302b being rotated in a same direction of rotation about a common axis of rotation. The first support arm 302a and the second support arm 302b may in this case be situated in a common plane.

In some embodiments, the described methods may include the first support arm 302a and the second support arm 302b being rotated in opposite directions of rotation about a common axis of rotation.

In various embodiments, it is possible, for example owing to high process temperatures that are used for the coating or other processing of the substrates, for a cooling structure to be provided in the vacuum chamber 102. For example, the substrate holding arrangement 104 has a cooling structure at least in sections. The cooling structure is configured for cooling (in other words: for dissipating waste heat from the structure to be cooled). Alternatively or in addition, the cooling structure may be configured to reduce the amount of heat acting on the structure to be cooled. For example, the cooling structure has heat shield plates or the like.

In various embodiments, the cooling structure may be configured for cooling the first and/or second substrate holder 304a, 304b. Alternatively or in addition, the cooling structure is configured for cooling the first and/or second support arm 302a, 302b. In various embodiments, the cooling structure may have a cooling channel or multiple independent cooling channels, for example in each case or collectively for the support arms 302a, 302b and the substrate holders 304a, 304b. A cooling channel is for example configured for conducting a cooling liquid, for example water. In other words: the cooling structure may be a water-type cooling means of the substrate holding arrangement 104 or a part thereof. For example, that part of the substrate holding arrangement 104 which is to be cooled has a double-walled housing, wherein, during operation, water is conducted through between the double wall.

It is self-evident that, for the cooling of the substrate holding arrangement 104, at least one correspondingly configured cooling circuit may be provided, for example having cooling lines, sensors, valves etc. For example, within the supply hose 112, there is arranged at least one coolant supply line by means of which a "cold" coolant can be supplied for the cooling structure of the substrate holding arrangement 104 and a "warmed" coolant can be discharged from the substrate holding arrangement 104.

In various embodiments, the vacuum chamber 102 has two sluice chambers 202a and at least three process chambers 202b. Furthermore, a valve arrangement 402s may be used for separating the respective sluice chamber 202a from a process chamber 202b, which adjoins said sluice chamber, in terms of a vacuum. Multiple further valve arrangements 402s may be used for separating mutually adjacent process chambers 202b in terms of a vacuum.

The multiple process chambers 202b may for example have two heating chambers 302b and a coating chamber 302c arranged between the two heating chambers. The substrates can be supplied to the coating chamber 302c from two mutually opposite sides, for example by means of in each case one substrate holding arrangement 104, one bearing arrangement 106 and one supply hose 112, as described above. As can be seen, substrates can be transported by means of a first substrate holding arrangement 104 and a second substrate holding arrangement 104 into the coating chamber 302c and coated successively or alternately.

In other words:

In various embodiments, a processing arrangement (for example a vacuum installation) is provided which is configured to treat (to process) at least one substrate 306 on multiple sides, for example on two sides. The processing arrangement is for example a coating installation which permits the coating of mutually adjacently held substrates on one side or two sides (that is to say the front side and rear side thereof).

The processing arrangement may have: a processing chamber with a processing region 202b; at least one working device which is arranged in the processing region 202b of the processing chamber; and a substrate holding arrangement for transporting and/or positioning the substrates 306 with respect to the working device in the processing region 202b. The substrate holding arrangement has at least one first support arm with a first substrate holder 304a, 304b and a second support arm with a second substrate holder 304a, 304b with a substrate holding arrangement 104. In various embodiments, the first support arm may be configured to be movable independently of the second support arm.

In various embodiments, in the processing arrangement (for example a vacuum installation and/or a pass-through installation) a coating process (that is to say a coating of the substrate), such as for example cathode sputtering (so-called sputtering or magnetron sputtering), can be performed by means of the working device. For example, wafers and substrates 306 of relatively small area can be worked, for example coated, on one side and/or on both sides. Such a processing arrangement may for example be used in the photovoltaics sector, for example in order to produce at least one of the following cell concepts: a heterojunction technology (HJT) solar cell, an interdigitated back contact (IBC) solar cell, a through-connection (wrap-through—WT) solar cell, an (aluminium) back surface field (BSF) solar cell, a passivated emitter and rear cell (PERC) solar cell, a passivated emitter rear locally diffused (PERL) back contact solar cell, or a passivated emitter rear totally diffused (PERT) back contact solar cell. Aside from heterojunction technology (HJT) solar cells, the stated cell concepts may require working of substrates, for example of the wafers, only on one side.

The processing chamber may be configured and/or operated as a vacuum chamber or as an atmospheric pressure chamber or as a positive-pressure chamber. The processing chamber may be connected via a sluice system (not illustrated) to a charging chamber. The processing chamber may be configured such that a process environment (including process pressure, process gas composition, process temperature etc.) can be set and/or controlled therein. For example, the processing chamber may be of pressure-stable (for example up to at least 1 bar pressure difference), gas-tight and/or dust-tight design. The working of the first substrate and/or of the second substrate may be performed in the presence of positive pressure (higher than 1 bar), atmospheric pressure approximately 1 bar, negative pressure (lower than 1 bar) or vacuum (lower than 0.3 bar), for example fine vacuum (lower than 1 mbar), for example high vacuum (lower than $10^{-3}$ bar), for example ultrahigh vacuum (lower than $10^{-7}$ bar). To set and/or control the process gas composition, it is possible for the interior of the processing chamber to be supplied, for example by means of a gas supply, with a gas having at least a reactive gas and/or a working gas. To set and/or control the process pressure, the processing chamber may be coupled to a pump arrangement having at least a primary pump and/or a vacuum pump, which evacuate the interior of the processing chamber. To set and/or control the process temperature, the processing arrangement may have heating devices and/or cooling devices which can supply thermal energy (for heating purposes) to, or extract thermal energy (for cooling purposes) from, the interior of the processing chamber, or at least the substrate 306 transported therein.

The processing chamber is for example a vacuum chamber (or a chamber with at least a negative pressure), which can be evacuated through a suction port. In a vacuum installation in which a coating process is performed, such as for example cathode sputtering (the so-called sputtering or magnetron sputtering), wafers and substrates 306 of relatively small area can be worked, that is to say coated, on both sides. That is to say, one and the same substrate 306 can be worked on both sides in one run-through of the method. Such concepts are used for example in the photovoltaics sector, for example in the cell concept of heterojunction technology (HJT) solar cells.

The working device may be configured for providing a gaseous coating material, for example a material vapour source, for example a physical vapour deposition (PVD) material vapour source.

In various exemplary embodiments, a working device in the processing chamber is configured as an elongate material source. The material source has for example the form of an evaporator crucible. Above the evaporator crucible, and in the direction of the longitudinal axis thereof, there are arranged multiple substrates 306.

In various embodiments, the processing arrangement may have at least one first working device and one second working device in the processing region 202b.

The first working device may be configured for working at least a first substrate, for example for coating, for irradiation, for etching etc. The second working device may be configured for working at least a second substrate, for example for coating, for irradiation, for etching etc., for example identically or differently in relation to the first working device. The first working device and/or the second working device may, for coating have, or be formed from, at least one of the following: a physical material vapour source (for coating by means of physical vapour deposition), such as for example a magnetron (also referred to as sputtering source, optionally in conjunction with a reactive gas source for reactive sputtering), a laser-beam evaporator, an arc evaporator, an electron beam evaporator and/or a thermal evaporator; or a chemical material vapour source (for coating by means of chemical vapour deposition), such as for example a reaction gas source optionally in conjunction with a plasma source (for coating by means of plasma-assisted chemical vapour deposition). Alternatively or in addition, the first working device and/or the second working device may, for the removal of material, have or be formed from at least one of the following: a plasma source, an ion beam source or an etching gas source. Alternatively or in addition, the first working device and/or the second working device may, for irradiation, have or be formed from at least one of the following: an ion beam source, an electron beam source or a light source (for example flash lamps and/or lasers).

In various embodiments, the working of the first substrate and the working of the second substrate may be performed at least partially simultaneously. In other words, the working of the first substrate and the working of the second substrate may at least partially overlap in terms of time. Alternatively, the working of the first substrate and the working of the second substrate may be performed in succession, that is to say with a time interval to one another.

By means of the first working device, the first substrate 306, for example the first side thereof, can be worked for example from below (for illustrative purposes, the underside thereof). By means of the second working device, the second substrate 306, for example the first side thereof, can be worked for example from above (for illustrative purposes, the top side thereof).

For example, magnetrons may be used as coating devices as working devices. Furthermore, electron beam evaporators may be used as coating devices as working devices.

For example, the substrate 306 or the substrates 306 may be coated with at least one of the following: a functional layer, a corrosion prevention layer, an optically active layer, a protective layer, an electrically conductive layer, an electrically insulating layer, a seal, a seed layer, a surface finishing. For example, a functional layer may be applied to foils or hard material (for example for battery technology). For example, a metal coating and/or a coating composed of dielectric material may be applied to glass (for example for spectacles, windows, mobile telephones and/or architectural glass). For example, an electrically conductive protective layer, a functional layer or a corrosion prevention layer may be applied to a metal foil (for example for fuel cell technology). For example, a seed layer may be applied to a wafer (for example for semiconductor technology). The seed layer may for example have or be formed from nickel (Ni) and/or copper (Cu). The seed layer may subsequently be galvanically further coated, for example in order to form metal layers.

The substrate holding arrangement described herein may be used for transporting and/or positioning the multiple substrates 306 in a processing chamber (for example in a vacuum chamber or in an atmospheric pressure chamber or in a positive-pressure chamber). Here, the processing chamber may have one or more processing devices (for example coating devices) for processing (for example coating) the multiple substrates 306 on one or both sides in a processing region 202b (for example coating region) of the processing chamber.

In the embodiment with the at least one first working device and one second working device, the transport system is configured for transporting and/or positioning the substrates 306 between the two working devices.

The first and second substrate holders 304a, 304b are part of the substrate holding arrangement transport system, which permits a rotation and pivoting of the multiple substrates 306 in the processing chamber. The transport system is configured such that the first substrate holder 304a, 304b can be pivoted and rotated independently of the second substrate holder 304a, 304b in the processing chamber, as will be described in more detail below.

In various embodiments, the substrate holding arrangement may however also have more than two support arms 302a, 302b with one substrate holder 304a, 304b and/or multiple substrate holders 304a, 304b per support arm.

For evacuation in order to produce a vacuum, or for gas desorption, the substrate holder 304a, 304b may have mechanical, for example PVD-compatible, channels which, by way of illustration, do not become blocked in the case of coatings, or can be cleaned ex-situ.

The inclination, the angle, of the first or second support arm or of the first or second substrate holders may have a value relative to a normal direction, which runs perpendicular to a working direction of the working device and/or perpendicular to the substrate 306, in a range from approximately 0° to approximately 40°, for example in a range from approximately 10° to approximately 30°, for example of approximately 20°. The first support arm and the second support arm may for example enclose an angle with one another which lies for example in a range from 0° to 180°, for example in a range from approximately 0° to approximately 90°, for example in a range from approximately 10° to approximately 30°, for example approximately 20°.

In various embodiments, the substrate holding arrangement described herein may be used for transporting substrates, for example wafers, in a processing chamber, for example in a horizontal coating installation, for example for the coating of the substrates 306 by means of a physical vapour deposition (PVD) and/or chemical vapour deposition (CVD) process. Here, the substrate holding arrangement may be provided, and the working device configured, such that the substrates 306 can be coated from below and/or from above, for example from below and from above simultaneously, or for example successively from below and from above, without the substrates 306 being discharged from the coating installation.

The expressions "top side" and "underside" of the substrates 306 may refer to the top side and underside of an areal, plate-like substrate 306. The substrate holding arrangement may be configured such that the substrate 306 can be oriented as desired in space. For example, the substrate holding arrangement may be configured such that one side of the substrate can be oriented vertically (that is to say perpendicular to the force of gravity), horizontally (that is to say parallel to the force of gravity) and/or at some other angle with respect to the working device.

The multiple substrates 306 are held by at least one first substrate holder 304a and one second substrate holder 304b. On the inner sides, directed toward one another, of the substrate holders 304a, 304b, there are arranged couplings or substrate holding devices for the substrates 306, wherein the axes of rotation of the couplings or the substrate holding devices are oriented at an angle, for example perpendicular, to the abovementioned plane of symmetry.

A substrate holder 304a, 304b may have in each case one or more substrate receptacles 310.

A substrate receptacle 310 is in each case configured for holding a substrate. A substrate receptacle 310 is a holding device which holds a substrate 306 on the substrate holder 304a, 304b, for example by means of a positively locking and/or non-positively locking connection.

A substrate receptacle 310 may be configured to be mounted rotatably in the substrate holder 304a, 304b. By means of a rotation of the substrate receptacle 310, it is thus possible for the substrate 306 to be rotated about an axis which is oriented at an angle, for example perpendicular, with respect to the substrate holder 304a, 304b. The rotation of a substrate holding arrangement 104 may be performed by means of a mechanical coupling element which is connected to a drive device of the drive train of the substrate holder, which drive train is arranged outside the processing region 202b.

The construction of the substrate receptacle 310 may be such that automatic loading and unloading of wafers and masks is possible.

In the case of a process with masking on both sides, with the aim of achieving a uniform coating of the top side and of the bottom side of the substrates 306, it may for example be necessary or expedient for the same geometric conditions (for example target spacing, gas separation, effective area, angle of incidence, shadowing etc.) to be realized on both sides.

The substrate receptacle 310 may optionally have a cassette receptacle which makes it possible for at least one cassette with at least one substrate 306 inserted therein to be inserted.

The substrate holders 304a, 304b and support arms 302a, 302b may be formed as hollow bodies. The hollow bodies may each surround or enclose a drive shaft. Alternatively, the hollow bodies may surround one or more electrical lines which are in each case connected to a drive.

The drive shafts may be connected via mechanical coupling elements 314a-d, for example via angle drives, to the couplings and to a drive device 308a-d. In other words: the first support arm may be connected to a first drive device (also referred to as motor support arm 1), the second support arm may be connected to a second drive device (also referred to as motor support arm 2), the first substrate holder 304a may be connected to a third drive device (also referred to as motor substrate rotation 1), and the second substrate holder 304b may be connected to a fourth drive device (also referred to as motor substrate rotation 2). The first, second, third and fourth drive devices may each be implemented as separate motors. The motors and mechanical coupling elements are however configured such that the first and second support arms and the first and second substrate holder can be controlled (e.g. driven) independently of one another, for example can be rotated independently of one another. Independent control means that the direction of rotation, the angle of rotation and the angular speed of the first and second support arms and first and second system carriers are in each case not necessarily coupled to one another but can be set independently of one another.

In various exemplary embodiments, the drive is arranged at least partially outside the processing region 202b. For example, at least one drive device of the first, second, third and fourth drive devices is situated outside the processing region 202b.

At least one substrate 306 may have or be formed from one of the following: a ceramic, a glass, a semiconductor (for example amorphous, polycrystalline or monocrystalline semiconductor, such as silicon), a metal, a polymer (for example plastic). For example, a substrate 306 or multiple substrates 306 may each be a plastics foil, a wafer, a metal foil, a metal sheet or a glass plate.

At least one substrate 306 may be of plate-like form. Alternatively or in addition, at least one side of a substrate may be of non-planar form, for example angled and/or structured, for example in the case of a turbine blade as a substrate 306.

In various embodiments, a substrate holder (referred to here for example as substrate holder or as substrate receptacle) may be fastened to an atmospheric box (referred to here for example as supply housing). Said box has for example all of the required drives and media connections situated therein. The supply may be provided to the drives and media connections in said box by means of a flexible (bendable and/or stretchable) supply hose. The supply hose may for example connect the atmospheric box to a through hole in the chamber wall of the vacuum chamber, in which the atmospheric box is arranged, such that access into the atmospheric box from outside the vacuum chamber is ensured.

In various embodiments, all components may be configured for the fully automatic loading and/or unloading of the wafers and of the masks thereof. In various embodiments, the loading of the substrate holding device with substrates may be performed after all parts have been cleaned, for example after a wet chemical cleaning process or after a dry ice blasting process.

Below, various examples will be described which relate to that which has been described above and illustrated in the figures.

Example 1 is a vacuum chamber arrangement which has: a vacuum chamber; at least one processing region which is arranged in the vacuum chamber; and a substrate holding arrangement for transporting and/or positioning a substrate or multiple substrates in the processing region, wherein the substrate holding arrangement has: a first drive train with a first substrate holder, wherein the first substrate holder is configured to rotatably hold one or more substrates, a second drive train with a first support arm, wherein the first substrate holder is held rotatably by the first support arm, a third drive train with a second substrate holder, wherein the second substrate holder is configured for rotatably holding one or more substrates, and a fourth drive train with a second support arm, wherein the second substrate holder is held rotatably by the second support arm, and wherein the first, second, third and fourth drive trains are each configured to be controllable or driveable independently of one another.

In example 2, the vacuum chamber arrangement as per example 1 may include that the processing device is configured as a coating device for depositing a material on the one substrate or the multiple substrates.

In example 3, the vacuum chamber arrangement as per example 1 or 2 may include that the first support arm and the second support arm are mounted so as to be movable independently of one another. The first support arm and the second support arm are for example mounted so as to be rotatable independently of one another.

In example 4, the vacuum chamber arrangement according to one of examples 1 to 3 may include that the vacuum chamber has a first supply feedthrough. The substrate holding arrangement has a vacuum-tight supply housing for the supply of at least one supply medium to the substrate holder. The supply housing has a second supply feedthrough. The first supply feedthrough is connected by means of a supply hose to the second supply feedthrough.

In example 5, the vacuum chamber arrangement as per one of examples 1 to 4 may include that the second drive train and the fourth drive train each have a drive device and a mechanical coupling element which is connected to a drive device, and the mechanical coupling element is configured to transmit the drive power of the drive device for the rotation of the substrate holder to the substrate holder.

In example 6, the vacuum chamber arrangement according to one of examples 1 to 5 may include that the first drive train and the third drive train each have a drive device and a mechanical coupling element which is connected to the drive device, and the mechanical coupling element is configured to transmit the drive power of the drive device for the pivoting of the support arm to the support arm.

In example 7, the vacuum chamber arrangement according to one of examples 1 to 6 may include that the first drive train and the third drive train each have a first drive device, and may optionally include that the second drive train and the fourth drive train each have a second drive device, which differs from the first drive device.

In example 8, the vacuum chamber arrangement according to one of examples 1 to 7 may include that the first, second, third and fourth drive trains each have a drive device, and wherein the substrate holding arrangement is configured such that the drive devices of the first, second, third and fourth drive trains are arranged outside the vacuum region.

In example 9, the vacuum chamber arrangement according to one of examples 1 to 8 may include that the first and second support arms and the first and second substrate holders are arranged in the vacuum region.

In example 10, the vacuum chamber arrangement according to one of examples 1 to 9 may furthermore include a bearing arrangement by means of which the substrate holding arrangement is mounted movably b within the vacuum chamber.

In example 11, the vacuum chamber arrangement according to one of examples 1 to 10 may furthermore include a control device which is connected to the first, second, third and fourth drive trains and which is configured to control the movement of the first and second support arms and of the first and second substrate holders.

In example 12, the vacuum chamber arrangement according to example 11 may optionally include that the control device is configured such that first support arm and the second support arm are rotatable in the same direction of rotation about a common axis of rotation.

In example 13, the vacuum chamber arrangement according to example 11 or 12 may include that the control device is configured such that the first support arm and the second support arm are rotatable in opposite directions of rotation about a common axis of rotation.

In example 14, the vacuum chamber arrangement according to one of examples 11 to 13 may include that the control device is configured such that, during a pivoting of a support arm of the first and second support arms, through an angle with an angular speed, the angular speed of the rotation of the (respective) substrate holder, is adapted in a manner dependent on the angle and the angular speed of the support arm.

Example 15 is a method for processing a substrate in a vacuum chamber arrangement, the vacuum chamber arrangement as per one of the examples 1 to 14. The method includes pivoting the first support arm independently of the movement or position of the second support arm.

Example 16 is a method for processing a substrate in a vacuum chamber arrangement, the vacuum chamber arrangement as per one of the examples 1 to 14. The method includes adapting the angular speed during the rotation of the substrate holder in a manner dependent on the angle and the angular speed of the support arm, if the support arm of the first and second support arms, is pivoted through an angle with an angular speed.

In example 17, the method as per example 15 or 16 may include that the first support arm and the second support arm are rotated in the same direction of rotation about a common axis of rotation.

In example 18, the method as per example 15 or 16 may include that the first support arm and the second support arm are rotated in opposite directions of rotation about a common axis of rotation.

What is claimed is:
1. A vacuum chamber arrangement, having:
a vacuum chamber;
at least one processing region which is arranged in the vacuum chamber;
a substrate holding arrangement for transporting and/or positioning a substrate or multiple substrates in the processing region; and a control device, wherein the substrate holding arrangement has:
- a first drive train with a first substrate holder, wherein the first substrate holder is configured to hold one or more substrates such that the one or more substrates are rotatable about a first axis,
- a second drive train with a first support arm, wherein the first substrate holder is held rotatably by the first support arm such that the one or more substrates are rotatable about a second axis, wherein the first axis is nonparallel to the second axis,
- a third drive train with a second substrate holder, wherein the second substrate holder is configured for rotatably holding one or more second substrates, and
- a fourth drive train with a second support arm, wherein the second substrate holder is held rotatably by the second support arm, and
- wherein the first, second, third and fourth drive trains are each configured to be controllable or driveable independently of one another,
- and wherein the control device is connected to the first, second, third and fourth drive trains, is configured to control the movement of the first and second support arms and of the first and second substrate holders, and is configured to, when the first support arm rotates about the second axis through a first angle at a first angular speed, control the first drive train based on the first angle or the first angular speed.

2. The vacuum chamber arrangement according to claim 1,
wherein the processing region has a section of a processing device which is configured as a coating device for depositing a material on the one substrate or the multiple substrates.

3. The vacuum chamber arrangement according to claim 1,
wherein the first support arm and the second support arm are configured to rotate independently of one another.

4. The vacuum chamber arrangement according to claim 1,
wherein the vacuum chamber has a first supply feedthrough, and
wherein the substrate holding arrangement has a vacuum-tight supply housing for the supply of at least one supply medium to the first substrate holder, wherein the supply housing has a second supply feedthrough, and
the first supply feedthrough is connected by means of a supply hose to the second supply feedthrough.

5. The vacuum chamber arrangement according to claim 1,
wherein the first drive train has a first mechanical coupling element which is connected to a first drive device, wherein the first mechanical coupling element is configured to transmit drive power from the first drive device to the first substrate holder in order to rotate the first substrate holder, and the third drive train has a second mechanical coupling element which is connected to a second drive device, wherein the second mechanical coupling element is configured to transmit drive power from the second drive device to the second substrate holder in order to rotate the second substrate holder.

6. The vacuum chamber arrangement according to claim 1,
wherein the second drive train has a first mechanical coupling element which is connected to a first drive device, wherein the first mechanical coupling element is configured to transmit drive power from the first drive device to the first support arm in order to rotate the first support arm, and the fourth drive train has a second mechanical coupling element which is connected to a second drive device, wherein the second mechanical coupling element is configured to transmit drive power from the second drive device to the second support arm in order to rotate the second support arm.

7. The vacuum chamber arrangement according to claim 1,
wherein the first drive train and the third drive train each have a first drive device, and
wherein the second drive train and the fourth drive train each have a second drive device, which differs from the first drive device.

8. The vacuum chamber arrangement according to claim 1,
wherein the first, second, third and fourth drive trains each have a drive device, and wherein the substrate holding arrangement is configured such that the drive devices of the first, second, third and fourth drive trains are arranged outside the vacuum region.

9. The vacuum chamber arrangement according to claim 1,
wherein the first and second support arms and the first and second substrate holders are arranged in the vacuum region.

10. The vacuum chamber arrangement according to claim 1, furthermore having a mounting arrangement by means of which the substrate holding arrangement is mounted movably within the vacuum chamber.

11. The vacuum chamber arrangement according to claim 1,
wherein the control device is configured such that the first support arm and the second support arm are rotatable in the same direction of rotation about a common axis of rotation.

12. The vacuum chamber arrangement according to claim 1,
wherein the control device is configured such that the first support arm and the second support arm are rotatable in opposite directions of rotation about a common axis of rotation.

13. The vacuum chamber arrangement according to claim 1, further comprising a third substrate holder held rotatably about a third axis by the first support arm, wherein the third axis is configured to rotate independently from the first axis.

14. A method for processing a substrate in a vacuum chamber arrangement, the vacuum chamber arrangement having:
- a vacuum chamber;
- at least one processing region which is arranged in the vacuum chamber; and
- a substrate holding arrangement for transporting and/or positioning a substrate or multiple substrates in the processing region,
wherein the substrate holding arrangement has:
- a first drive train with a first substrate holder, wherein the first substrate holder is configured to rotatably hold one or more substrates such that the first drive train is configured to rotate the first substrate holder about a first axis,
- a second drive train with a first support arm, wherein the first substrate holder is held rotatably by the first support arm such that the second drive train is configured to rotate the first substrate holder about a second axis, wherein the first axis is nonparallel to the second axis, a third drive train with a second substrate holder, wherein the second substrate holder is configured for rotatably holding one or more substrates, and a fourth drive train with a second support arm, wherein the second substrate holder is held rotatably by the second support arm, and wherein the first, second, third and fourth drive trains are each configured to be controllable or driveable independently of one another, wherein when the first support arm rotates about the second axis through a first angle at a first angular speed, the first drive train is controlled based on the first angle or the first angular speed;

the method comprising:

pivoting the first support arm independently of the movement or position of the second support arm.

15. The method according to claim 14, wherein the first support arm and the second support arm are rotated in the same direction of rotation about a common axis of rotation.

16. The method according to claim 14, wherein the first support arm and the second support arm are rotated in opposite directions of rotation about a common axis of rotation.

17. A method for processing a substrate in a vacuum chamber arrangement, the vacuum chamber arrangement having:

a vacuum chamber;

at least one processing region which is arranged in the vacuum chamber; and a substrate holding arrangement for transporting and/or positioning a substrate or multiple substrates in the processing region, wherein the substrate holding arrangement has:

a first drive train with a first substrate holder, wherein the first substrate holder is configured to rotatably hold one or more substrates, a second drive train with a first support arm, wherein the first substrate holder is held rotatably by the first support arm, a third drive train with a second substrate holder, wherein the second substrate holder is configured for rotatably holding one or more substrates, and a fourth drive train with a second support arm, wherein the second substrate holder is held rotatably by the second support arm, and wherein the first, second, third and fourth drive trains are each configured to be controllable or driveable independently of one another;

the method comprising:

rotating by the second drive train the first support arm about a second axis through a first angle at a first angular speed; and rotating by the first drive train the first substrate holder about a first axis at a second angular speed that depends on the first angle and the first angular speed, wherein the first axis is nonparallel to the second axis.

18. The method of claim 17, wherein the first support arm and the second support arm are rotated in the same direction of rotation about a common axis of rotation.

19. The method of claim 17, wherein the first support arm and the second support arm are rotated in opposite directions of rotation about a common axis of rotation.

20. The method of claim 17, wherein rotating the first support arm and/or rotating the first substrate holder comprises rotating the one or more substrates within the processing region.

* * * * *